(12) United States Patent
Egitto et al.

(10) Patent No.: US 6,203,652 B1
(45) Date of Patent: Mar. 20, 2001

(54) METHOD OF FORMING A VIA IN A SUBSTRATE

(75) Inventors: Frank D. Egitto; John S. Kresge, both of Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/345,326

(22) Filed: Jun. 30, 1999

(51) Int. Cl.[7] .............................. B32B 31/18; H05K 3/40
(52) U.S. Cl. .................... 156/247; 156/253; 156/272.8; 156/275.5; 156/289; 156/323; 219/121.71; 29/852
(58) Field of Search ...................... 156/247, 253, 156/272.8, 275.5, 289, 308.2, 323, 344; 219/121.71; 174/262, 264; 29/830, 852

(56) References Cited

U.S. PATENT DOCUMENTS

| | | |
|---|---|---|
| 4,857,698 | 8/1989 | Perun . |
| 4,959,119 | 9/1990 | Lantzer . |
| 5,293,025 | 3/1994 | Wang . |
| 5,493,096 | 2/1996 | Koh . |
| 5,584,956 | 12/1996 | Lumpp et al. . |
| 6,023,041 | 2/2000 | Noddin . |

FOREIGN PATENT DOCUMENTS

| | | |
|---|---|---|
| 58-58987 | * 4/1983 | (JP) . |
| 58-218387 | * 12/1983 | (JP) . |
| 59-33091 | * 2/1984 | (JP) . |

OTHER PUBLICATIONS

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, May 1994.

* cited by examiner

Primary Examiner—Michael W. Ball
Assistant Examiner—Michael A. Tolin
(74) Attorney, Agent, or Firm—Schmeiser, Olsen & Watts; Lawrence R. Fraley

(57) ABSTRACT

A method of forming a via in a substrate is provided. The method generally includes laminating a support to the substrate, forming the via in the substrate, and then stripping the support from the substrate. The support is preferably a photoresist that collects any debris generated by the via formation so that the debris is removed from the via and substrate surface as the photoresist support is stripped.

18 Claims, 6 Drawing Sheets

METHOD OF FORMING A VIA IN A SUBSTRATE

BACKGROUND OF THE INVENTION

1. Technical Field

The present invention generally relates to a method of forming a via in a substrate, and more particularly, to a method for forming a via in a substrate using a support.

2. Background Art

In the production of substrates, such as printed wiring boards or laminated chip carriers, the formation of vias, through holes, or the like is often necessary. As such, various drilling methods are employed. However, a problem exists when the vias are formed in that the entry and exit portions of the vias are often left distorted by the drilling operation. In addition, debris from formation of the vias remains disposed along the entry and exit portions of the vias. This debris is not only adverse to the performance of the substrate, but is also time consuming and costly to remove. Although a number of methods of forming such vias exists, no previous method eliminates these problems, hereinafter referred to as "volcanoing."

Heretofore, many have attempted to develop suitable methods of forming vias, but have fallen short. One such example of this is shown in Japanese Publication No. 58218387 JP A1, in which plastic powder is packed as a backing material on a workpiece as a laser drills a hole therethrough. However, because the plastic powder is not laminated to the workpiece, additional components, such as a piston, are necessary to maintain the contact between the backer and the workpiece. In addition, the plastic powder does not aid in the removal of the debris generated from drilling the workpiece. In contrast, upon removal of the plastic powder, the debris is still present on the workpiece.

Another example of a backing material is shown in Japanese Publication No. 58058987 JP A1, which teaches the use of a metallic plate as a backer material. Specifically, a metallic plate is closely adhered to a workpiece which is then pierced by a laser to form holes therein. By, adhering a metal plate to the workpiece, however, additional process steps are required to remove the backing plate. Moreover, the rigid nature of a metallic plate fails to collect the debris created from drilling the workpiece, thus, leaving the debris disposed along the surfaces of the workpiece.

Yet another example of a backer material is shown in Japanese Publication No. 59033091 JP A1, which teaches the contact of a "plate-like" object into tight contact with a workpiece. Once tight contact is achieved, the workpiece can then be laser drilled to form holes therethrough. Similar to the above reference, however, the use of a plate-like object not only requires additional process steps for removal, but also fails to remove the debris generated by the drilling operation.

Lastly, U.S. Pat. No. 4,857,698 to Perun, herein incorporated by reference, teaches the use of an adhesive tape as a backer material. In particular, Perun shows an adhesive tape that is adhered to an article which is then drilled to form holes therein. However, the use of adhesive tape can be costly, and its removal can result in structural damage to a workpiece, especially if the workpiece is thin and lightweight. In addition, the removal of residue from the tape adhesive requires additional processing steps.

Therefore, there exists a need for a support material, hereinafter referred to as a "support," that can be used in the formation of vias or the like, such that the entry and exit portions of the vias are evenly formed (not distorted). In addition, there exists the need for a support that will remove any debris generated by the drilling operation from the workpiece surface upon removal of the support.

SUMMARY OF THE INVENTION

The present invention overcomes the deficiencies of the related art by providing a method of forming vias in a substrate or the like, such that the entry and exit portions of the via are evenly formed and any debris generated by the via formation is removed with the support.

According to one aspect of the present invention, a method of forming a via in a substrate is provided. The method includes the steps of: (1) laminating a support to the substrate; (2) forming a via in the substrate; and (3) stripping the support from the substrate.

According to a second aspect of the present invention, a method of forming a via in a substrate is provided. The method includes the steps of: (1) providing the substrate; laminating a photoresist support to the substrate; (2) forming at least one via through the substrate; and (3) stripping the support from the substrate.

According to a third aspect of the present invention, a method of forming a via in a substrate is provided. The method includes the steps of: (1) providing a substrate; (2) laminating a photoresist support to the substrate; (3) exposing the photoresist support; (4) forming a via in the substrate; and (5) stripping the photoresist support from the substrate It is therefore an advantage of the present invention to provide a method of forming a via in a substrate or the like, such that the entry and exit portions of the via are evenly formed (not distorted) and any debris generated by the formation of the via is removed.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
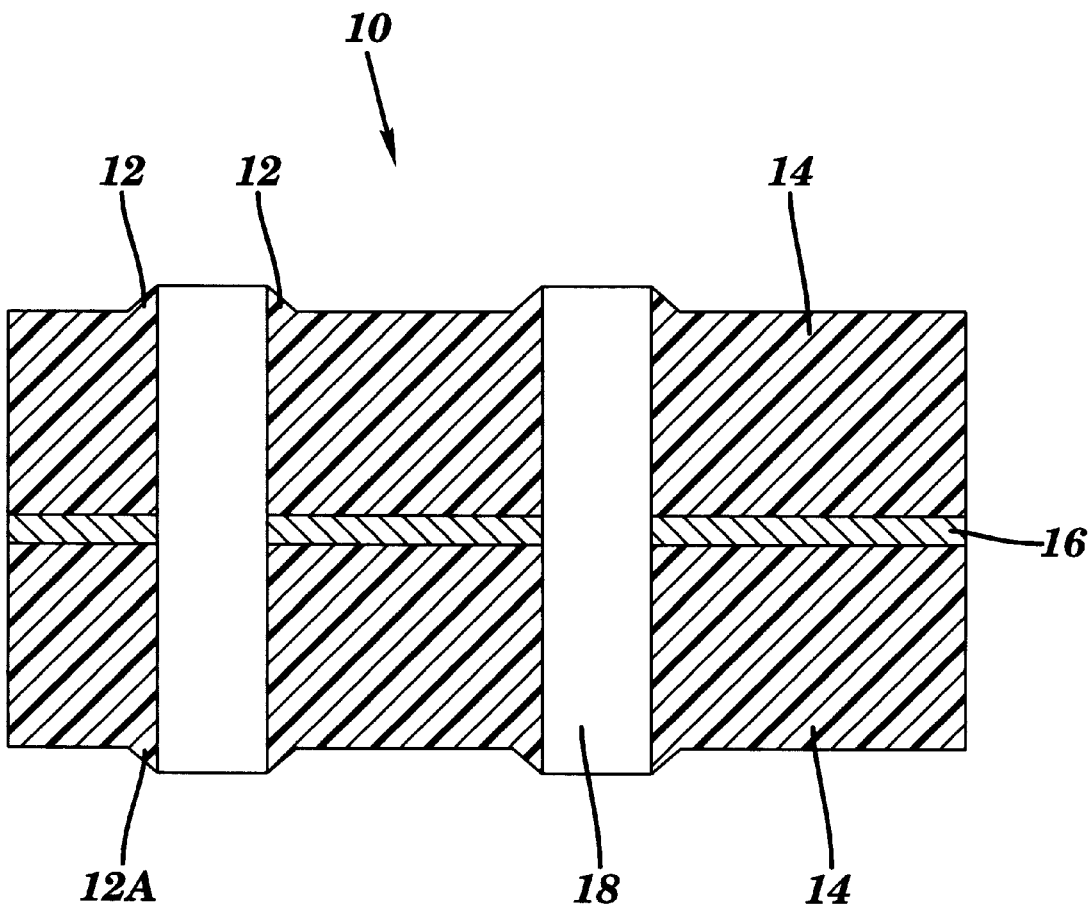
FIG. 1 is a cross-sectional view of a substrate having vias formed by a known method.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements between the drawings.

DETAILED DESCRIPTION OF THE INVENTION

Figure 2:
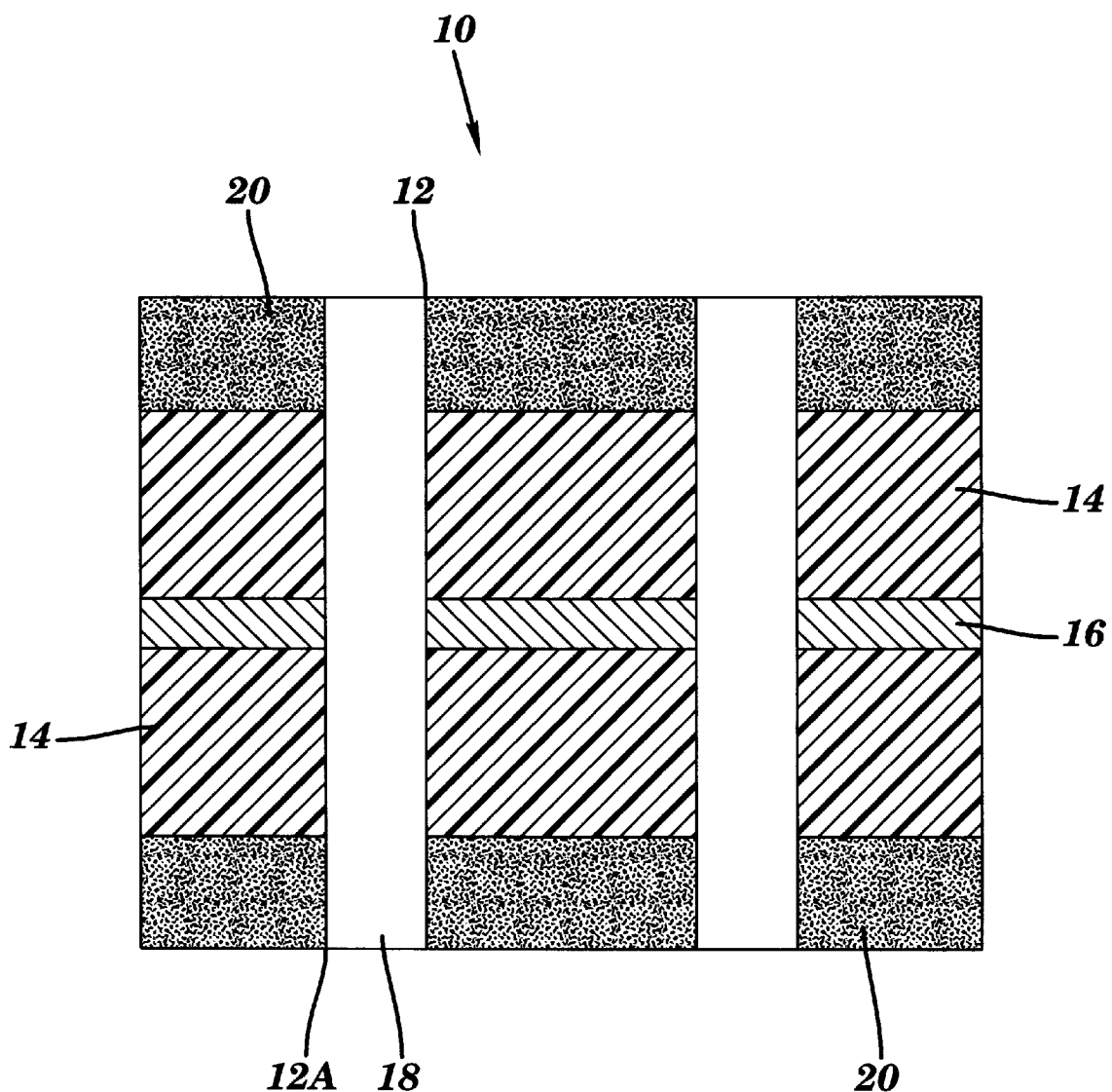
FIG. 2 is an cross-sectional view of a substrate having vias formed in accordance with the present invention, before the support is removed.
Figure 3:
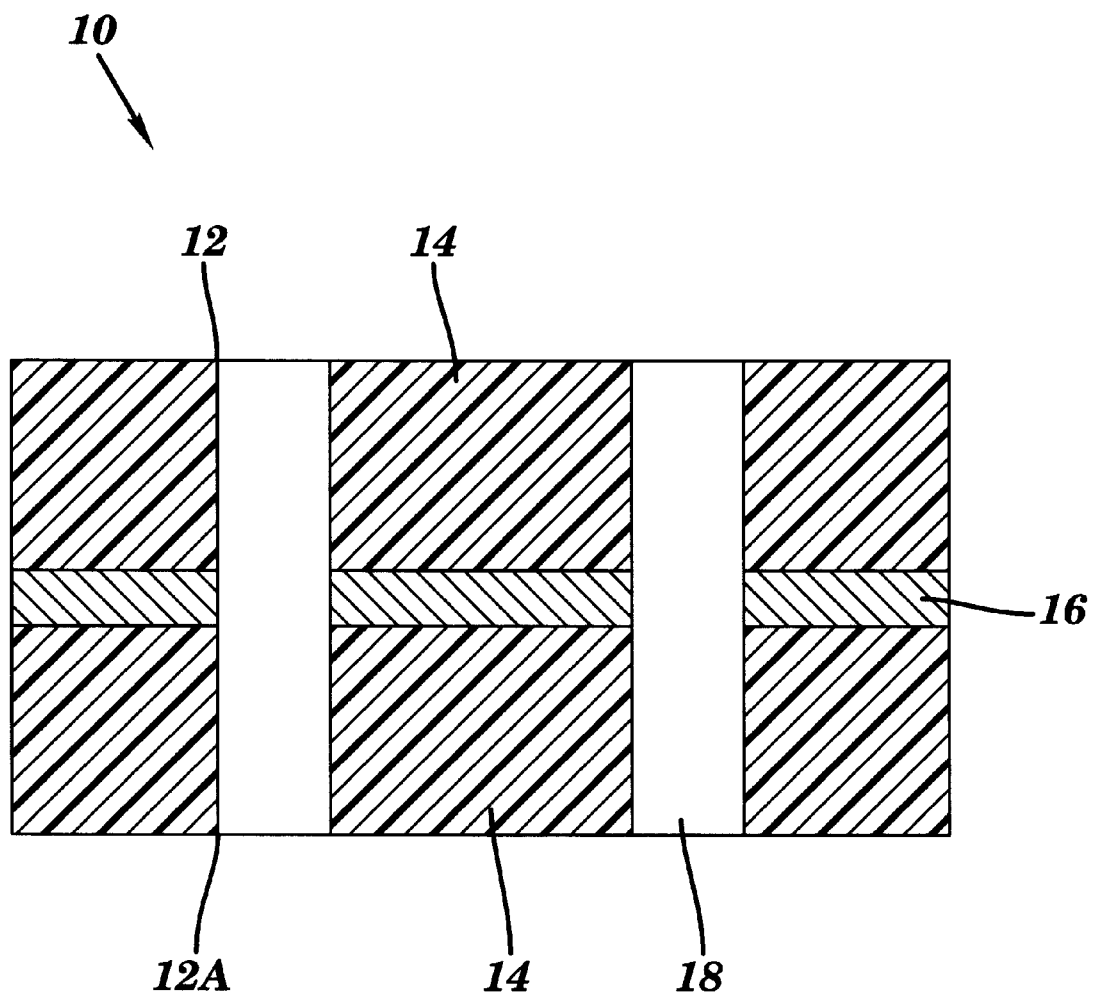
FIG. 3 is an cross-sectional view of a substrate having vias formed in accordance with the present invention, after the support is removed.

Referring now to the drawings, FIG. 1 shows a substrate 10 or the like, having vias formed therethrough in accordance with a known method. The substrate 10 generally includes dielectric or insulative layers 14, an electrically conductive layer 16 therebetween, and vias 18. It should be appreciated, however, that substrates, such as those shown throughout FIGS. 1–3, are well known to those of ordinary skill in the art, and accordingly, the form of the substrate 10 may vary. For example, the substrate 10 may have several additional electrically conductive layers 16 and dielectric layers 14. In addition, electrically conductive layers 16 may be etched to form a circuit pattern.

The substrate 10 of FIG. 1 shows vias 18 that were formed in the substrate 10 without the use of a support or with the use of an inadequate support. As can be seen, the entry 12 and exit 12A portions of the vias 18 were distorted during the via forming operation. Such a phenomena is referred to as volcanoing, due to the physical appearance of the entry 12 and exit 12A portions. Volcanoing is caused by failure to reinforce the entry 12 and exit 12A portions of the vias 18 during the drilling of the substrate 10. In particular, as the drill (not shown) enters the substrate at entry portion 12 and exits at exit portion 12A, the substrate material displaced by the drill is forced towards the entry 12 and exit 12A portions of the vias 18. This leaves the substrate 10 not only with distorted vias, but also with an excess of debris disposed along the surface of the substrate 10.

However, by providing a support at the exit portion 12A, the entry portion 12, or both, the substrate is reinforced and the problems associated with volcanoing and excess debris are eliminated. FIG. 2 shows a substrate 10 with vias 18 drilled therethrough. As shown, the substrate was laminated with a support 20 prior to the drilling operation. In particular, the support 20 is laminated to the substrate 10 during the original formation of the substrate 10 or thereafter, but in all cases, support 20 is laminated prior to the formation of the vias 18. Preferably, support 20 is laminated to the substrate 10 using a hot roll laminator. Alternately, vacuum lamination or other suitable lamination technique may be employed to laminate the support 20 to the substrate 10.

The support 20 is preferably a photoresist, such as Dupont Riston 9008 or other acrylate-based photoresist, however, it should be appreciated that many other photoresists may suffice. In addition, although support 20 is shown as having been laminated to both sides of the substrate 10, it should be appreciated that a user may selectively laminate the support 20 to the underside or exit portion 12A of the of the substrate 10, or to the top or entry portion 12 of the substrate 10.

Once the vias 18 have been drilled in a manner known in the art, the support 20 is stripped from the substrate 10 leaving clean, evenly formed vias 18 without debris, as shown in FIG. 3. As indicated above, the support 20 is preferably a photoresist material. As such, the photoresist support 20 can be removed according to any method generally known in the art. For example, a Dupont Riston 9008 resist can be stripped using a 25% solution of Dupont Riston S-100X in $H_2O$. The advantages of using a photoresist as a support 20 include its ease of removal after the vias 18 have been drilled. Specifically, related art devices using plating, require additional mechanical processing steps to effect its removal. In contrast, the photoresist support 20 can be easily removed with chemical processes. In addition, any debris generated during the via formation is deposited onto the photoresist material. Accordingly, removal of the photoresist support 20 from the substrate 10 is accompanied with removal of all debris from the substrate 10.

Figure 4:
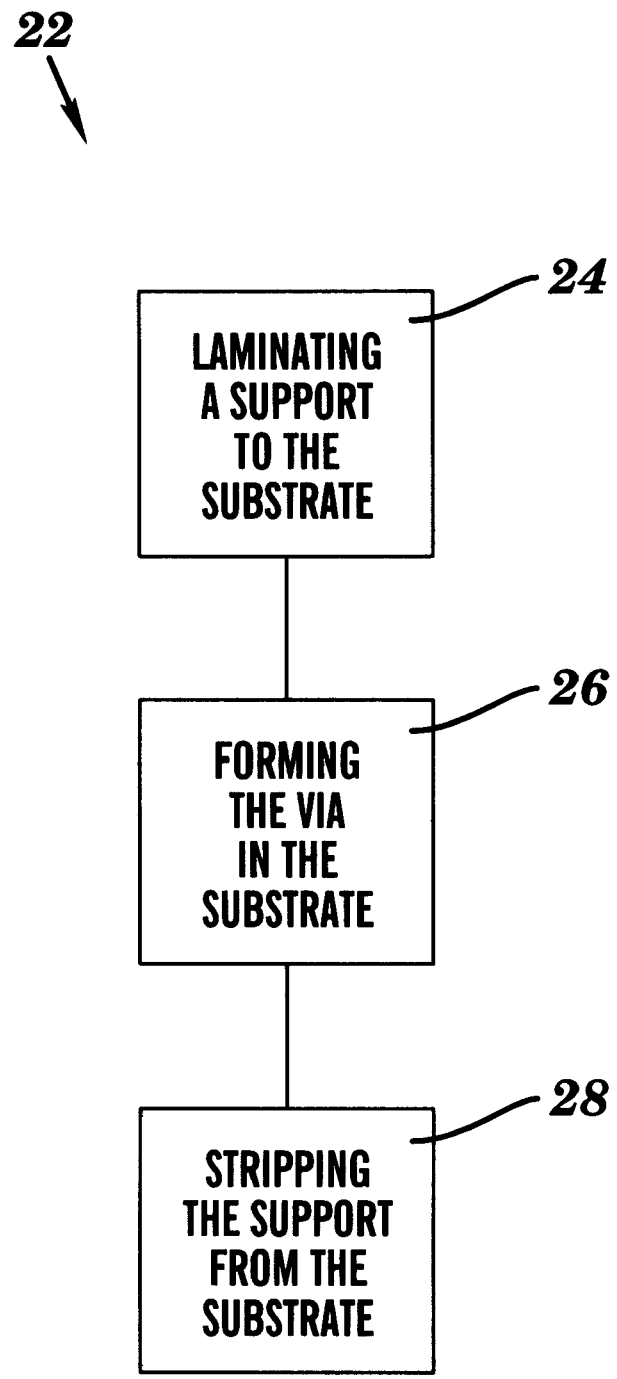
FIG. 4 is a flowchart of a method of forming a via in a substrate, in accordance with the present invention.
Figure 5:
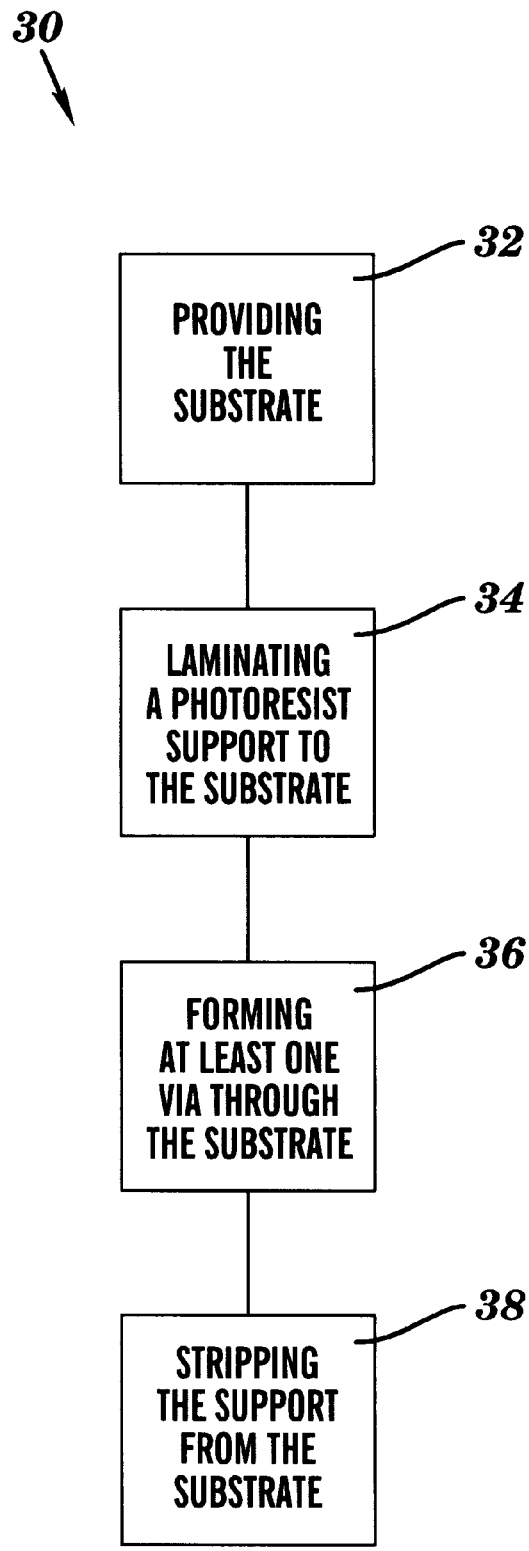
FIG. 5 is a flowchart of an alternative method of forming a via in a substrate, in accordance with the present invention.
Figure 6:
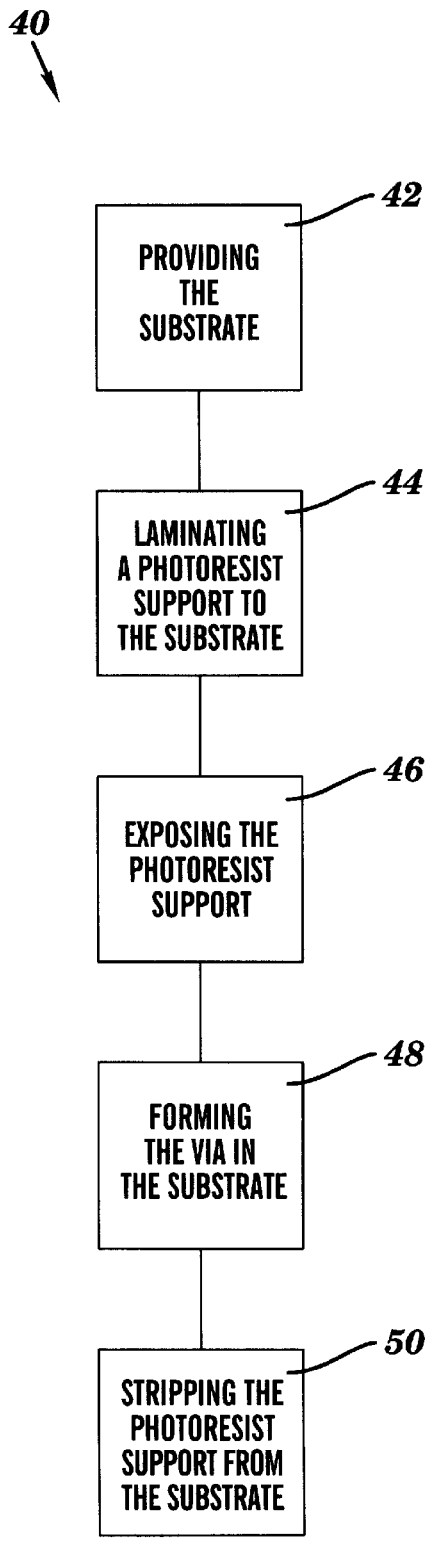
FIG. 6 is a flowchart of an alternative method of forming a via in a substrate, in accordance with the present invention.

FIGS. 4–6 show three alternative methods of forming the via(s) 18 in the substrate 10. Referring first to FIG. 4, the first step 24 of the method 22 is to laminate a support to the substrate. This is shown in FIG. 2, and is performed according to methods known in the art. The second step 26 of the method 22 is to form the via in the substrate. Via formation is also well known in the art and is preferably accomplished with a 355 nanometer Nd:YAG laser. However, it should be appreciated that many other methods of via formation exist. For example, the via could be formed with a mechanical drill. In addition, by forming a via in a substrate having the support of the present invention, a substrate having evenly formed vias will result. The final step 28 of the method 22 is to strip the support from the substrate. As indicated above, stripping of the support may accomplished by any suitable method known in the art. In addition, since the support collects any debris generated during the formation of the via, the subsequent removal of the support also serves to remove the debris from the substrate surface.

FIG. 5 shows an alternative method 30 of forming a via in a substrate. In particular, the first step 32 of the method 30 to provide a substrate. As stated above, the form of the substrate may vary and one such example is shown throughout FIGS. 1–3. The second step 34 of the method 30 is the lamination of a photoresist support to the substrate. The third step 36 in the method 30 is to form at least one via through the substrate. Since the form of substrates may vary, so may the quantity of vias and the method used to form the vias. Accordingly, the number of vias formed will vary depending on the needs of the user. In addition, the via is preferably formed using a 355 nanometer Nd:YAG laser, however, it should be understood that other equivalent means for forming vias exist. By forming the via in a substrate having the support of the present invention, a substrate having an evenly formed via will result, as shown in FIG. 3. The last step 38 of the method 30 is to strip the support from the substrate. Again, the stripping may be accomplished by any means generally known in the art. Moreover, any debris generated during the via formation is deposited onto the photoresist support. Accordingly, the stripping of the support will also remove all debris from the substrate surface.

Finally, FIG. 6 shows an additional alternative method 40 of forming a via in a substrate. Specifically, the first step 42 of the method 40 is to provide a substrate. As previously indicated, the substrate provided may take varying forms depending on the needs of the user. The second step 44 is to laminate a photoresist support to the substrate. The next step 46 in the method 40 is to expose the photoresist support. Specifically, the photoresist support is exposed to a light source to stiffen and strengthen the support. This is so that the support may provided rigid reinforcement to the substrate during the drilling operation. Preferably the support is exposed to an ultraviolet light source having a dose of approximately 80 milijoules/$cm^2$. However, those in the art will understand that other means for exposing the support exist. The next step 48 in the method 40 is to form the via in the substrate. As indicated, the via may be formed by a variety of known techniques, however, the via is preferably formed by a 355 nanometer Nd:YAG laser. Moreover, by forming the vias in a substrate having the support of the present invention, evenly formed vias will result. Finally, the last step 50 of the method 40 is to strip the photoresist support from the substrate. Once again, methods of stripping the photoresist support from the substrate are commonly known in the art. Moreover, because any debris generated during the formation of the via is deposited onto the photoresist support, the subsequent removal of the support from the substrate will also remove the debris from the substrate.

EXAMPLE

A substrate is provided having a dielectric material laminated to both sides of a metal foil. The dielectric material is a composite of poly(tetrafluoroethylene) filled with inorganic particles (e.g., fused silica). The particle dimensions are on the order of 5 micrometers or less. About 40% (by weight) of the dielectric material is composed of these particles. One example of such a dielectric material is provided by Rogers Corporation under the name RO-2800. The metal is typically copper, or copper-clad Invar. The substrate is laminated at a temperature of 380° C. and a pressure of 1700 PSI. Dupont Riston 9008 photoresist is laminated to both sides of the substrate using a hot roll laminator at a temperature of 105° C. and a pressure of 100 PSI. Using a frequency-tripled Nd:YAG laser operating at a wavelength of 355 nm, vias are formed through the entire cross-section, i.e., through the top photoresist layer, the substrate, and the bottom photoresist layer. It is not required, however, that the vias extend completely through the bottom photoresist layer. Following via formation, the photoresist layers are stripped from both sides of the substrate using a 25% solution of Dupont Riston S-1100X in $H_2O$. The stripping solution is applied in a conveyorized spray system at a temperature of 140° F. and a spray pressure of 30 PSI. Following the stripping step, the substrate is rinsed using DI water (room temperature, 20 PSI) and dried using an air shower at a temperature of 120° F.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method of forming a via in a substrate, comprising the following steps:
    laminating a photoresist support to the substrate;
    after the laminating step, forming a via in the substrate; and
    after the forming step, stripping the support from the substrate.

2. The method of claim 1, wherein the laminating step comprises the step of using a hot roll laminator to laminate the support to the substrate.

3. The method of claim 1, wherein the laminating step comprises the step of laminating the support to a top surface and a bottom surface of the substrate.

4. The method of claim 1, wherein the forming step comprises the step of drilling the via with a laser.

5. The method of claim 1, wherein the forming step comprises the step of forming the via through the substrate.

6. The method of claim 1, further comprising the step of exposing the support to strengthen the support, after the laminating step.

7. The method of claim 6, wherein the exposing step comprises the step of exposing the support to an ultraviolet light source.

8. The method of claim 6, wherein the exposing step comprises the step of exposing the support to a light source.

9. A method of forming a via in a substrate, comprising the following steps:
    providing the substrate;
    laminating a photoresist support to the substrate;
    after the laminating step, forming at least one via through the substrate; and
    after the forming step, removing debris produced by the forming step by stripping the support from the substrate.

10. The method of claim 9, further comprising the step of exposing the photoresist support to an ultraviolet light source to strengthen the support.

11. The method of claim 9, further comprising the step of exposing the photoresist support to a light source to strengthen the support.

12. The method of claim 9, wherein the laminating step comprises the step of laminating the photoresist support to a top side and a bottom side of the substrate.

13. The method of claim 9, wherein the laminating step comprises the step of using a hot roll laminator to laminate the photoresist support to the substrate.

14. The method of claim 9, wherein the forming step comprises the step of drilling at least one via with a laser.

15. A method of forming a via in a substrate, comprising the following steps:
    providing the substrate;
    laminating a photoresist support to the substrate exposing the photoresist support to strengthen the support;
    after the laminating step, forming a via in the substrate; and
    after the forming step, stripping the photoresist support from the substrate.

16. The method of claim 15, wherein the laminating step comprises the step of using a hot roll laminator to laminate the photoresist support to the substrate.

17. The method of claim 15, wherein the exposing step comprises the step of exposing the photoresist support to a light source.

18. The method of claim 15, wherein the forming step comprises the step of forming a via in the substrate using a laser.

* * * * *